United States Patent
Hsia et al.

(10) Patent No.: US 7,592,710 B2
(45) Date of Patent: Sep. 22, 2009

(54) BOND PAD STRUCTURE FOR WIRE BONDING

(75) Inventors: Chin-Chiu Hsia, Taipei (TW); Chih-Hsiang Yao, Taipei (TW); Tai-Chun Huang, Hsin-Chu (TW); Chih-Tang Peng, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 90 days.

(21) Appl. No.: 11/409,297

(22) Filed: Apr. 21, 2006

(65) Prior Publication Data
US 2007/0205508 A1 Sep. 6, 2007

Related U.S. Application Data

(60) Provisional application No. 60/778,725, filed on Mar. 3, 2006.

(51) Int. Cl.
*H01L 23/48* (2006.01)
*H01L 23/52* (2006.01)
*H01L 29/40* (2006.01)
*H01L 27/10* (2006.01)
*H01L 29/739* (2006.01)
*H01L 29/73* (2006.01)
*H01L 29/74* (2006.01)

(52) U.S. Cl. .............. 257/786; 257/202; 257/203; 257/204; 257/205; 257/206; 257/207; 257/208; 257/209; 257/210; 257/211; 257/758; 257/759; 257/760; 257/779; 257/780; 257/781; 257/784; 257/785; 257/E23.015; 257/E23.02; 257/E23.021

(58) Field of Classification Search ......... 257/202–211, 257/758–760, 779, 780–781, 784–786, E23.015, 257/E23.02, E23.021
See application file for complete search history.

(56) References Cited

U.S. PATENT DOCUMENTS

| 5,923,088 | A | 7/1999 | Shiue et al. |
| 6,043,144 | A | 3/2000 | Kuo |
| 6,144,100 | A | 11/2000 | Shen et al. |
| 6,232,662 | B1 | 5/2001 | Saran |
| 6,306,749 | B1 | 10/2001 | Lin |
| 6,313,537 | B1 | 11/2001 | Lee et al. |
| 6,528,881 | B1 | 3/2003 | Tsuboi |
| 6,560,862 | B1 | 5/2003 | Chen et al. |
| 6,614,091 | B1 * | 9/2003 | Downey et al. ............. 257/499 |

(Continued)

OTHER PUBLICATIONS

Chou, K.-Y. et al., "Active Circuits under Wire Bonding I/O Pads in 0.13 μm Eight-Level Cu Metal, FSG Low-$K$ Inter Metal Dielectric CMOS Technology[+]," IEEE Electron Device Letters, vol. 22, No. 10, Oct. 2001, pp. 466-468.

*Primary Examiner*—Ida M Soward
(74) *Attorney, Agent, or Firm*—Slater & Matsil, L.L.P.

(57) ABSTRACT

A bond pad structure of an integrated circuit is provided. The bond pad structure includes a conductive bond pad, a first dielectric layer underlying the bond pad, and an $M_{top}$ plate located in the first dielectric layer and underlying the bond pad. The $M_{top}$ plate is a solid conductive plate and is electrically coupled to the bond pad. The bond pad structure further includes a first passivation layer over the first dielectric layer wherein the first passivation layer has at least a portion under a middle portion of the bond pad. At least part of an active circuit is located under the bond pad.

20 Claims, 4 Drawing Sheets

U.S. PATENT DOCUMENTS

| | | |
|---|---|---|
| 6,734,093 B1 | 5/2004 | Sabin et al. |
| 6,756,671 B2 * | 6/2004 | Lee et al. .................... 257/737 |
| 6,822,329 B2 * | 11/2004 | Varrot et al. ................ 257/758 |
| 6,846,717 B2 | 1/2005 | Downey et al. |
| 6,864,583 B2 * | 3/2005 | Matsunaga et al. .......... 257/759 |
| 6,900,541 B1 | 5/2005 | Wang et al. |
| 6,913,946 B2 * | 7/2005 | Lin ............................ 438/106 |
| 7,038,280 B2 * | 5/2006 | Righter ...................... 257/355 |
| 7,115,985 B2 * | 10/2006 | Antol et al. ................. 257/700 |
| 7,157,734 B2 * | 1/2007 | Tsao et al. .................... 257/48 |
| 7,211,902 B2 * | 5/2007 | Yamaha ...................... 257/780 |
| 7,232,705 B2 * | 6/2007 | Righter ...................... 438/106 |
| 7,250,679 B2 * | 7/2007 | Otsuka ....................... 257/751 |
| 7,253,531 B1 | 8/2007 | Huang et al. |
| 7,276,797 B2 * | 10/2007 | Fan et al. .................... 257/774 |
| 7,323,406 B2 * | 1/2008 | Lim et al. ................... 438/622 |
| 7,345,898 B2 * | 3/2008 | Park et al. ..................... 365/63 |
| 7,420,283 B2 * | 9/2008 | Ito ............................. 257/779 |
| 7,425,767 B2 * | 9/2008 | Lin ............................ 257/781 |
| 7,521,812 B2 * | 4/2009 | Lee et al. .................... 257/784 |
| 2002/0111009 A1 * | 8/2002 | Huang et al. ................ 438/613 |
| 2003/0030153 A1 * | 2/2003 | Perry ......................... 257/782 |
| 2003/0047794 A1 * | 3/2003 | Watanabe ................... 257/503 |
| 2003/0127716 A1 | 7/2003 | Chou et al. |
| 2003/0218259 A1 * | 11/2003 | Chesire et al. .............. 257/786 |
| 2004/0155352 A1 * | 8/2004 | Ma ............................ 257/758 |
| 2004/0248359 A1 * | 12/2004 | Hieda ........................ 438/239 |
| 2005/0116345 A1 | 6/2005 | Murtuza |
| 2005/0258549 A1 | 11/2005 | Mathew |
| 2006/0065969 A1 | 3/2006 | Antol et al. |
| 2006/0071350 A1 | 4/2006 | Fan et al. |
| 2006/0091566 A1 * | 5/2006 | Yang et al. .................. 257/786 |
| 2006/0154469 A1 * | 7/2006 | Hess et al. .................. 438/618 |
| 2006/0154470 A1 | 7/2006 | Pozder et al. |
| 2006/0180946 A1 * | 8/2006 | Chen .......................... 257/786 |
| 2006/0189125 A1 * | 8/2006 | Kata et al. .................. 438/622 |
| 2007/0018331 A1 * | 1/2007 | Chen .......................... 257/774 |

* cited by examiner

BOND PAD STRUCTURE FOR WIRE BONDING

This application claims priority to provisional patent application Ser. No. 60/778,725, filed Mar. 3, 2006, and entitled "Bond Pad Structure for Wire Bonding," which application is incorporated herein by reference.

TECHNICAL FIELD

This invention relates generally to integrated circuits, and more particularly to the structure and formation methods of bond pad structures of integrated circuits.

BACKGROUND

Integrated circuit (IC) chips are often electrically connected by wires (e.g., gold or aluminum wires) to a package substrate in a packaging assembly to provide external signal exchange. Such wires are typically wire bonded to bond pads formed on an IC chip using thermal compression and/or ultrasonic vibration. A wire bonding process exerts thermal and mechanical stresses on a bond pad and on the underlying layers and structure below the bond pad. The bond pad structure needs to be able to sustain these stresses to ensure a good bonding of the wire.

Prior bond pad structures were fabricated from the bottom layer to the top layers, which did not allow metal wiring circuitry and semiconductor devices to pass under, or be located below, the bond pad structure. FIG. 1 illustrates a conventional wire bond pad structure. An interconnect structure 4 is formed on a semiconductor substrate 2. A passivation layer 6 is formed on the top metallization layer of the interconnect structure 4. A bond pad 8 is formed on the passivation layer 6. Bond pad 8 is electrically connected to metal lines 10 in the top metallization layer. A passivation pad 12, which is a portion of the passivation layer 6, remains under the bond pad 8. This structure is typically referred to as a bond-on-passivation structure since wires will be bonded to the bond pad, which is on the passivation pad 12. With the insulation of passivation pad 12, copper lines 14 can be formed in the top metallization layer.

In conventional integrated circuit structures such as the one shown in FIG. 1, the substrate regions under the bond pad 8 have no active devices formed in them, so that stresses applied to the active devices during bonding processes will not be applied directly on the active devices. For a more efficient use of chip area or to reduce the chip size, it is desirable to form semiconductor devices and metal wiring circuitry under the bond pad. This is sometimes referred to as bond over active circuits (BOAC). At the same time, many processes now use low-k and ultra low-k dielectric materials for the inter-metal dielectric (IMD) layers to reduce RC delay and parasitic capacitances. The general trend in IMD designs is that the dielectric constant (k) tends to decrease from the top downward toward the substrate.

However, as the dielectric constant (k) decreases, as a general rule, the strength of the dielectric material decreases. Hence, many low-k dielectric materials are highly susceptible to cracking or lack the strength needed to withstand some mechanical processes (e.g., wire bonding, CMP). Thus, a need exists for a bond pad structure that can sustain and better disperse the stresses exerted on it by a wire bonding process, that is compatible with the use of low-k dielectric materials for inter-metal dielectric layers, and that will also allow circuitry and devices to be formed under the bond pad.

SUMMARY OF THE INVENTION

In accordance with one aspect of the present invention, an integrated circuit structure includes a conductive bond pad, a first dielectric layer underlying the bond pad, an $M_{top}$ plate located in the first dielectric layer and underlying the bond pad wherein the $M_{top}$ plate is a solid conductive plate and is electrically coupled to the bond pad, a first passivation layer over the first dielectric layer wherein the first passivation layer has at least a portion under a middle portion of the bond pad, and at least part of an active circuit located under the bond pad.

In accordance with another aspect of the present invention, an integrated circuit structure includes a conductive bond pad, a first dielectric layer underlying the bond pad, an $M_{top}$ plate located in the first dielectric layer and underlying the bond pad wherein the $M_{top}$ plate is a solid conductive plate and is electrically coupled to the bond pad, and a first passivation layer over the first dielectric layer wherein the first passivation layer has at least a portion under a middle portion of the bond pad. The bond structure further includes a second dielectric layer underlying the first dielectric layer, and an $M_{top-1}$ plate located under the $M_{top}$ plate and in the second dielectric layer. The $M_{top-1}$ plate is preferably a solid conductive plate. The bond pad structure further includes a low-k dielectric layer located under the bond pad. At least part of an active circuit is located under the bond pad.

In accordance with yet another aspect of the present invention, a semiconductor chip includes a first bond pad structure. The first bond pad structure includes a conductive bond pad, a first dielectric layer underlying the bond pad, an $M_{top}$ plate located in the first dielectric layer and underlying the bond pad wherein the $M_{top}$ plate is a solid conductive plate and is electrically coupled to the bond pad, and a first passivation layer over the first dielectric layer wherein the first passivation layer has at least a portion under a middle portion of the bond pad. The semiconductor chip further includes a low-k dielectric layer located under the bond pad of the first bond pad structure, and a second bond pad structure comprising a second conductive bond pad. Preferably, at least part of an active circuit is located under the first bond pad structure, and no active circuit is located under the second bond pad structure.

With the metal plate and passivation pad protecting underlying structures and circuits, active circuits can be formed under bond pads.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Generally, an embodiment of the present invention provides an improved bond pad structure for an integrated circuit chip. An embodiment of the present invention is preferably designed so that at least part of the integrated circuits or active circuits formed in a chip may be located under at least some of the bond pad structures. This is advantageous to maximize the real estate of a chip and/or to reduce chip size. Several embodiments of the present invention will be described herein, which may be used in the context of wire bonding or solder ball/bump grid arrays, for example. However, any embodiment of the present invention also may be applied in other contexts.

Figure 1:
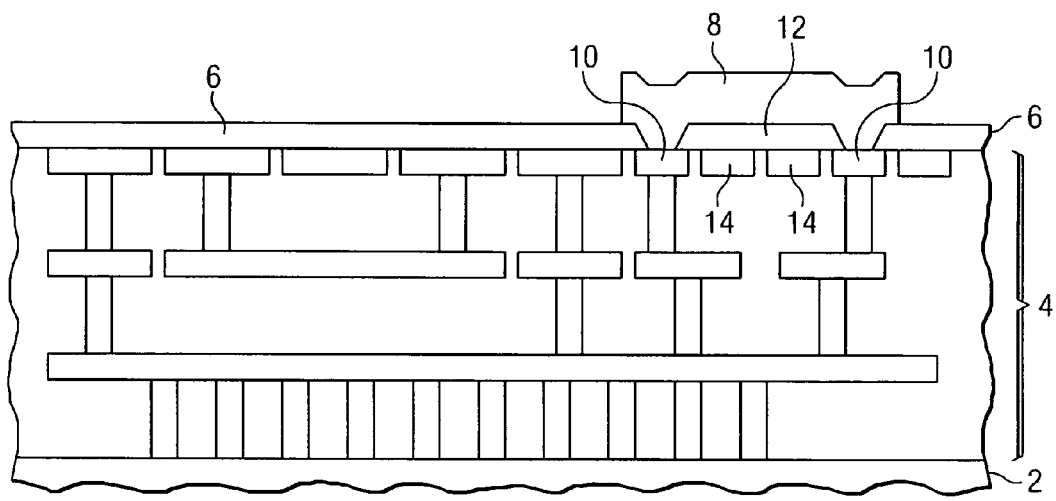
FIG. 1 illustrates a conventional bond pad structure with no active devices formed under the bond pad.
Figure 2:
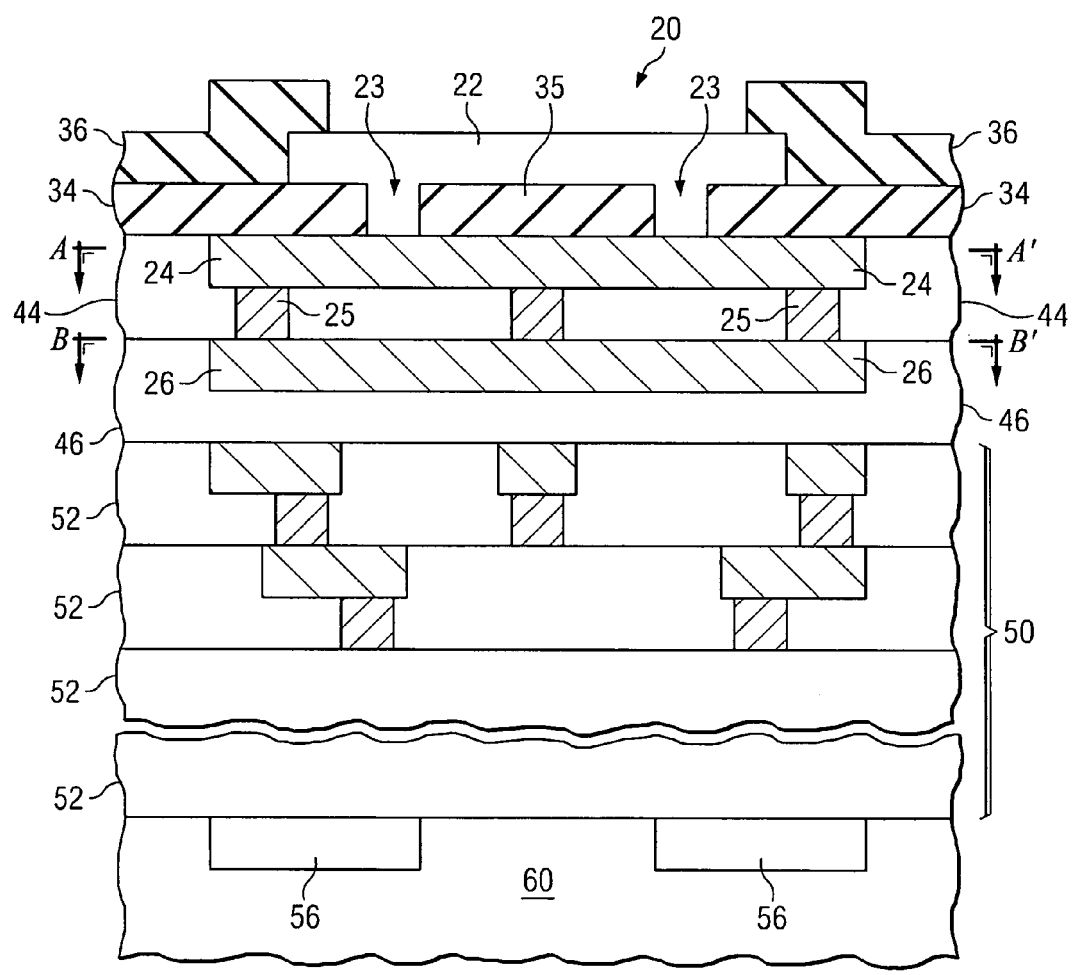
FIG. 2 is a cross-sectional view of a bond pad structure of the preferred embodiment.

Referring to FIG. 2, a bond pad structure 20 of the preferred embodiment has an $M_{top}$ plate 24 located under a bond pad 22. $M_{top}$ plate 24, which is preferably a conductive solid plate, is formed in a top dielectric layer 44. Bond pad 22 may be made from any of a wide variety of conductive materials, including (but not limited to): aluminum, gold, silver, nickel, copper, tungsten, titanium, tantalum, compounds thereof, alloys thereof, multiple layers thereof, composites thereof, and combinations thereof, for example.

$M_{top}$ plate 24 is electrically coupled to bond pad 22. In the preferred embodiment, bond pad 22 is formed over $M_{top}$ plate 24. The electrical connection is made through vias 23 in a first passivation layer 34. Vias 23 are preferably filled with a same material as bond pad 22. In other embodiments (not shown), there may be one or more layers intervening between bond pad 22 and $M_{top}$ plate 24. The connection between bond pad 22 and $M_{top}$ plate 24 may take various forms. In the preferred embodiment, individual vias 23 are formed, preferably arranged as an array. A portion 35 of the first passivation layer 34, which is under a middle portion of the bond pad 22, is thus physically connected to the rest of the portions not underlying the bond pad 22. In alternative embodiments, vias 23 are formed as slots, and the central portion 35 is disconnected from the remaining portions of the first passivation layer 34.

Referring again to FIG. 2, an $M_{top-1}$ plate 26 is located under $M_{top}$ plate 24. $M_{top-1}$ plate 26 is formed in a dielectric layer 46. $M_{top-1}$ plate 26 is preferably a solid conductive plate, although it can be non-solid. Optionally, vias 25 are formed connecting $M_{top}$ plate 24 and $M_{top-1}$ plate 26. The vias 25 may be formed as an array having a plurality of rows and columns. With the vias 25 physically connecting $M_{top}$ plate 24 and $M_{top-1}$ plate 26, stress exerted on $M_{top}$ plate 24 is spread to $M_{top-1}$ plate 26. Alternatively, $M_{top-1}$ plate 26 and $M_{top}$ plate 24 may be disconnected and separated by a dielectric layer, for example, dielectric layer 44.

$M_{top}$ plate 24 and $M_{top-1}$ plate 26 preferably comprise copper. Alternatively, $M_{top}$ plate 24 and $M_{top-1}$ plate 26 may comprise any of a wide variety of suitable conductive materials, such as aluminum, gold, silver, nickel, copper, tungsten, titanium, tantalum, compounds thereof, alloys thereof, multiple layers thereof, composites thereof, and combinations thereof. In the preferred embodiment, dielectric layer 44 has a dielectric constant value (k value) of greater than about 3.0, and preferably comprises undoped silicate glass (USG). A high k value helps improve mechanical strength and prevent moisture penetration. Dielectric layer 46 and dielectric layers underlying layer 46 are preferably low-k dielectric layers having k values less than about 3.0, more preferably less than about 2.5 (extreme low-k). In other embodiments, dielectric layers 44 and 46 are both formed of dielectric materials with k values greater than about 3.0, and are preferably formed of USG, while dielectric layers underlying dielectric layer 46 are low-k dielectric layers or extreme low-k dielectric layers.

A first passivation layer 34 is formed over the top metallization layer in which $M_{top}$ plate 24 is formed. Passivation layer 34 preferably comprises dielectric materials such as oxide or SiN formed using plasma enhanced chemical vapor deposition (PECVD).

A second passivation layer 36, which preferably comprises a same material as the passivation layer 34, although different materials can be used, is formed over the first passivation layer 34. Second passivation layer 36 has at least a portion over the bond pad 22, and thus provides a bonding force preventing the bond pad 22 from peeling from the passivation layer 34.

An interconnect structure 50, which includes one or more inter-metal dielectric (IMD) layers 52, is located under the $M_{top-1}$ plate 26. Such IMD layer(s) 52 typically include conducting lines, vias, and/or wires (not shown for simplicity) for the symbolically shown active circuits 56, which have at least a portion under the bond pad 22. Active circuits 56 are typically formed on and/or in a semiconductor substrate 60 (e.g., silicon, strained silicon, germanium, SOI, etc.). Active circuits 56 may include any of a wide variety of electrical or electronic devices, such as memory cells, logic devices, transistors, diodes, resistors, capacitors, inductors, and combinations thereof. Interconnect structure 50 may include one or more layers of low-k dielectric material(s), for example, IMD layers 52. Generally, as the dielectric constant (k) decreases for a low-k dielectric material, the structural strength of the material decreases as well. Yet, it is generally desired to use low-k dielectric materials in interconnect structure 50 that have lowest possible dielectric constant to reduce RC delay and parasitic capacitances. Preferred materials for the low-k dielectric layer(s) in the interconnect structure 50 include (but are not limited to): a dielectric material with a dielectric constant (k) less than 3.0, a dielectric material with a dielectric constant (k) less than 2.5, a low-k dielectric material including Si, C, N, and O, a porous low-k dielectric material, and combinations thereof, for example.

Figure 3:
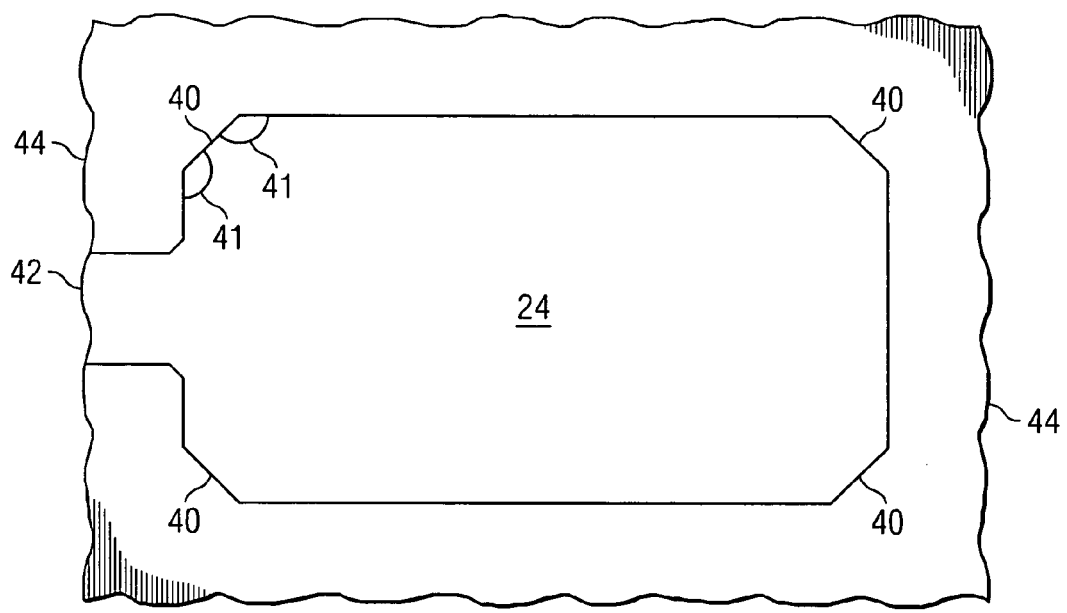
FIG. 3 is a top view of FIG. 2 along a line A-A'.

FIG. 3 is a top view of the $M_{top}$ plate 24 of the bond pad structure 20, as taken along a line A-A' in FIG. 2. In the preferred embodiment, the top profile shape of $M_{top}$ plate 24 has an $M_{top}$ plate area no less than the bond pad area for the top profile shape of the bond pad 22. In other embodiments, the $M_{top}$ plate area may be less than the bond pad area. Having the $M_{top}$ plate area being no less than the bond pad area is advantageous for evenly distributing bonding stress exerted on the bond pad 22 as it is imparted downward toward the active circuits. In an exemplary embodiment, the $M_{top}$ plate 24 of a bond pad structure 22 has a size of less than about 100 μm×100 μm.

The $M_{top}$ plate 24 preferably has a generally rectangular shape with notched corner regions 40, although it may have any other shape. Hence, the corner angles 41 at the corner regions 40 of the $M_{top}$ plate 24 are greater than 90 degrees. This shape may reduce stress concentrations at the corner regions 40 during a bonding process (e.g., wire bonding). In the preferred embodiment, a connection wire portion 42 extends from the $M_{top}$ plate 24 for providing an electrical connection with the $M_{top}$ plate 24. In other embodiments, the $M_{top}$ plate 24 may have more than one connection wire portion 42 extending therefrom. In yet other embodiments wherein vias 25 are formed, $M_{top}$ plate 24 has no connection wire portion 42 attached, and the electrical connection is made through vias 25 to $M_{top-1}$ plate 26, from which an electrical connection is made.

Figure 4:
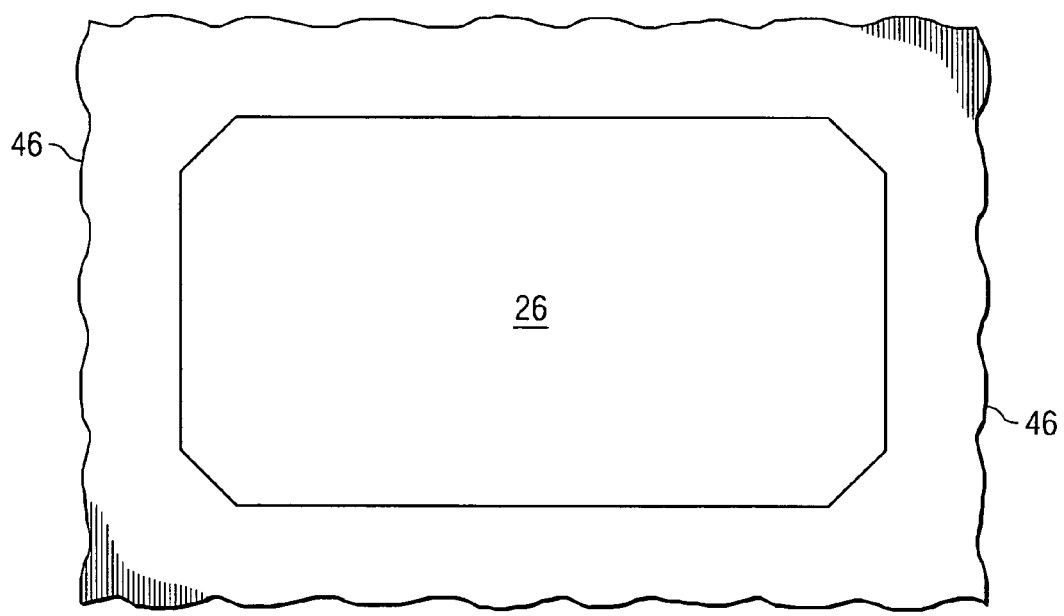
FIG. 4 is a top view of FIG. 2 along a line B-B'.

FIG. 4 is a top view showing the top profile shape of the $M_{top-1}$ plate 26 of the bond pad structure 22, as taken along a line B-B' in FIG. 2. The $M_{top-1}$ plate 26 preferably has a generally rectangular shape with notched corner regions, essentially the same as that of the $M_{top}$ plate 24, although it can have any other shape. In the preferred embodiment, wherein the $M_{top}$ plate 24 has an electrical connection 42, substantially no current flows through $M_{top-1}$ plate 26 even if vias 25 connect the $M_{top-1}$ plate 26 to the $M_{top}$ plate 24. Thus $M_{top-1}$ plate 26 is a "dummy" plate provided mainly for structural strengthening. In other embodiments wherein vias 25 are formed, $M_{top-1}$ plate 26 may have one or more connection wire portions extending therefrom, which are electrically connected to an active circuit or a ground voltage. Accordingly, $M_{top-1}$ plate 26 may be electrically connected to $M_{top}$ plate 24 and bond pad 22.

Figure 5:
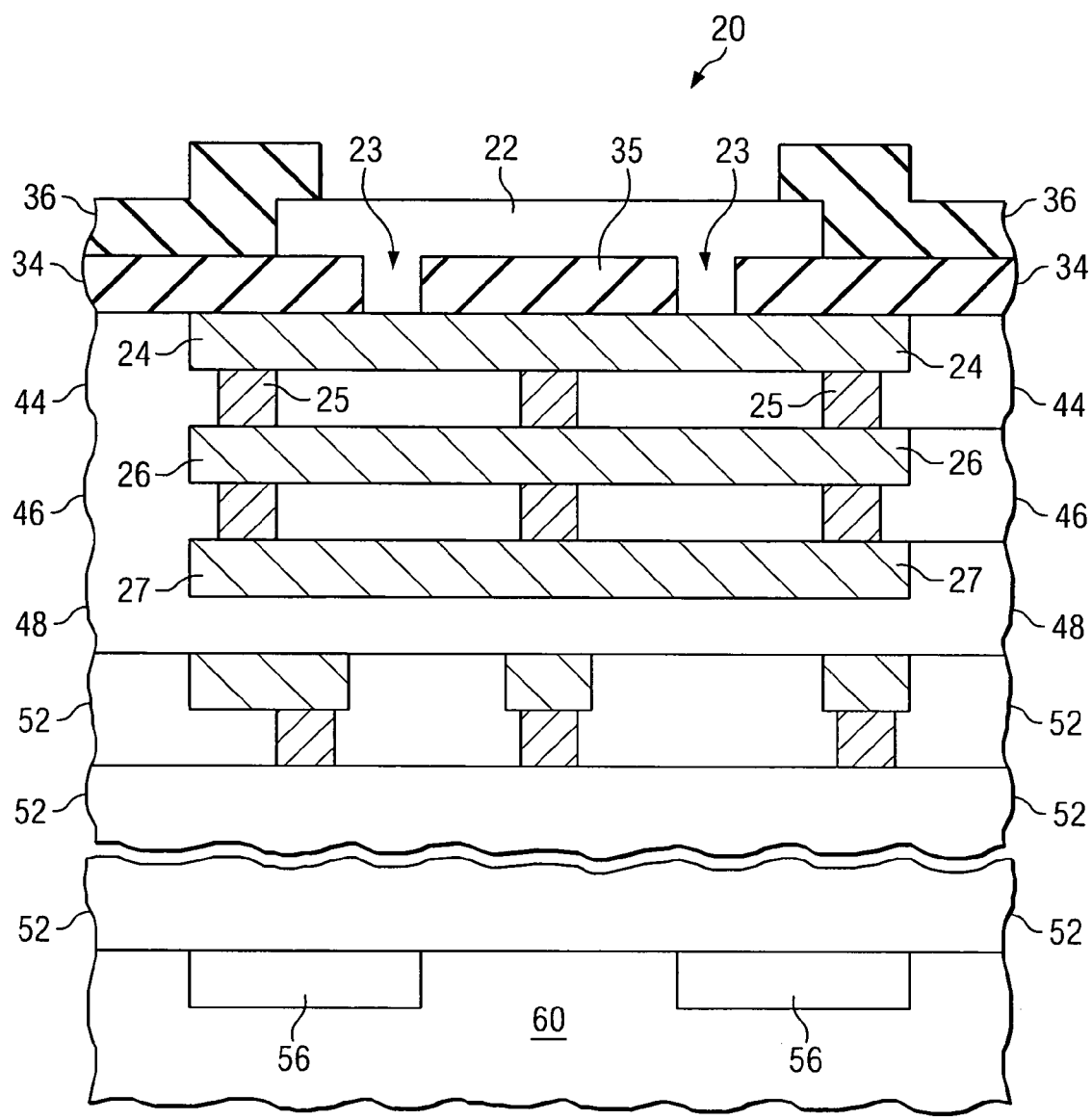
FIG. 5 is a cross-sectional view of a bond pad structure, wherein three metal plates are formed under a bond pad.

The preferred embodiments of the present invention may include only one metal plate (such as $M_{top}$ plate 24), two metal plates (such as $M_{top}$ plate 24 and $M_{top-1}$ plate 26 in FIG. 2), or even more than two metal plates under the bond pad 22. An embodiment including three metal plates 24, 26 and 27 is shown in FIG. 5. Metal plates 24, 26 and 27 may be interconnected by vias or separated by the corresponding dielectric layer therebetween. The materials of the dielectric layers 44, 46 and 48 may have various combinations. In one embodiment, dielectric layer 44 has a k value greater than about 3.0, and is preferably formed of USG. Dielectric layers 46 and 48 and the underlying IMD layers, on the other hand, are low-k (k value less than about 3.0) or extreme low-k (ELK, k value less than about 2.5) materials. In other embodiments, dielectric layers 44 and 46 have k values greater than about 3.0, and are preferably formed of USG. Dielectric layer 48 and the underlying IMDs are low-k or ELK materials.

Figure 6:
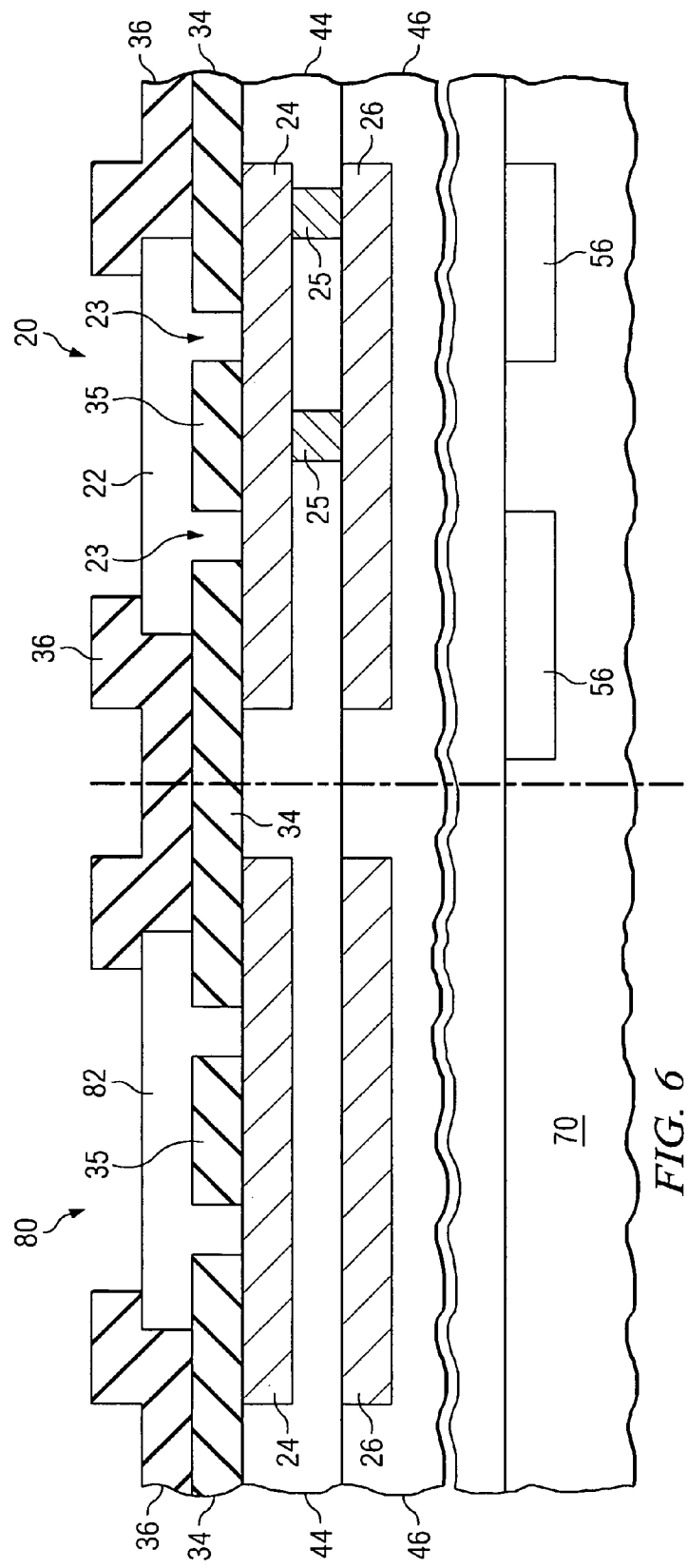
FIG. 6 is a cross-sectional view of two bond pad structures, wherein active circuits are formed under one of the bond pad structures but not under the other.

It should be appreciated by one skilled in the art that although the preferred embodiments discussed in the preceding paragraphs illustrate active devices 56 under the bond pad 22, under some other bond pads, for example, bond pad 82 in FIG. 6, there may be no active devices formed.

In FIG. 6, a semiconductor chip 70 has a first bond pad structure 20 with active circuits 56 having at least a portion located there under, and a second bond pad structure 80 with no active circuit there under. The first bond pad structure 20 is essentially the same as that of the preferred embodiment described above (refer to e.g., FIG. 2). The second bond pad structure 80, on the other hand, may have a same or a different bond pad structure as the bond pad structure 20. In one exemplary embodiment, bond pad structure 80 may have no metal plate formed under the bond pad 82. In other exemplary embodiments, bond pad structure 80 may have a different number of metal plates than bond pad structure 20. In yet other exemplary embodiments, the $M_{top}$ plates under bond pad 82 may be slotted (wherein slots are formed to separate metal pads into smaller pieces) or hollow (wherein a central portion of the metal pad comprises a dielectric material instead of a metal). In some other embodiments of the present invention (not shown), all of the bond pad structures may be located over the active circuit area having active devices therein.

A simulation has been performed to evaluate the bond pad structures formed using the preferred embodiments of the present invention. It has been found that metal plates under the bond pads may significantly reduce stresses and protect the underlying interconnect structures and active devices. Among metal plates having various shapes and profiles, such as solid metal plates, slotted metal plates and hollow metal plates, solid plates provide the most protection to the underlying structures. Simulation results have revealed that the interconnect structures and active devices under solid metal plates receive the lowest stress during bonding processes. However, metal plates having other shapes and profiles also provide certain levels of protection, all the combinations of solid pads, slotted pads and hollow pads are in the scope of the present invention.

The combination of the solid $M_{top}$ plate 24 and the solid $M_{top-1}$ plate 26 in the bond pad structure 20 (refer to FIGS. 2 and 5) provides further advantageous features for limiting or greatly reducing stress concentrations. Less stress may reach the underlying interconnect structure 50 and active circuits 56 during a bonding process. Thus, an embodiment of the present invention may permit at least part of an active circuit 56 to be located under a bond pad 22, while still using and obtaining the favorable electrical benefits of using a low-k interconnect structure 50.

Further simulation results have also revealed that the bond-on-passivation structure, wherein a passivation pad 35 is formed under bond pad 22 (refer to FIG. 2), can provide further protection. The stress applied to the underlying structures and devices is further reduced with the formation of a passivation layer under the bond pad.

The preferred embodiments of the present invention provide protection to integrated circuits having low-k dielectric materials during a bonding process. The failure rate of integrated circuits caused by the bonding process is thus significantly reduced. Experiment results have shown that the failure rate of integrated circuits having a solid $M_{top}$ plate 24, a solid $M_{top-1}$ plate 26 and a bond-on-passivation structure (with passivation portion 35 in FIG. 2) is at least less than one-third, and sometimes less than about one-eighth, the failure rate of integrated circuits with other metal plate profiles, such as slotted metal plates (which still provide more protection, thus have lower failure rates than bond pad structures having no metal plates).

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit structure comprising:
a conductive bond pad;
a first dielectric layer underlying the bond pad;

an $M_{top}$ plate located in die first dielectric layer and underlying the bond pad, the $M_{top}$ plate being a solid conductive plate and electrically coupled to the bond pad, wherein an area of the $M_{top}$ plate is greater than about an area of the bond pad from a top view;

a first passivation layer over the first dielectric layer, wherein the first passivation layer has at least a portion under a middle portion of the bond pad; and at least part of an active circuit located under the bond pad.

2. The integrated circuit structure of claim 1 further comprising a second passivation layer over the first passivation layer, wherein the second passivation layer further comprises a portion over a portion of the bond pad.

3. The integrated circuit structure of claim 1 further comprising a low-k dielectric layer located under the bond pad.

4. The integrated circuit structure of claim 1, wherein the first dielectric layer has a dielectric constant value of greater than about 3.0.

5. The integrated circuit structure of claim 4, wherein the first dielectric layer comprises un-doped silicate glass.

6. The integrated circuit structure of claim 1, wherein the area of the $M_{top}$ plate is greater than the area of the bond pad.

7. The integrated circuit structure of claim 1, wherein at least one corner of the $M_{top}$ plate has corner angles greater than 90 degrees.

8. The integrated circuit structure of claim 1 further comprising a second bond pad, wherein no active circuit is located under the second bond pad.

9. The integrated circuit structure of claim 8 further comprising a second $M_{top}$ plate under the second bond pad and in the first dielectric layer, the second $M_{top}$ plate being a solid conductive plate and electrically coupled to the second bond pad.

10. An integrated circuit structure comprising:
a conductive bond pad;
a first dielectric layer underlying the bond pad;
an $M_{top}$ plate located in the first dielectric layer and underlying the bond pad, the $M_{top}$ plate being a solid conductive plate and electrically coupled to the bond pad, wherein the $M_{top}$ plate has an area greater than an area of the bond pad in a top view;
a first passivation layer over the first dielectric layer, wherein the first passivation layer has at least a portion under a middle portion of the bond pad;
a second dielectric layer underlying the first dielectric layer;
an $M_{top-1}$ plate located under the $M_{top}$ plate and in the second dielectric layer, the $M_{top-1}$ plate being a conductive plate;
a low-k dielectric layer located under the bond pad; and
at least part of an active circuit located under the bond pad.

11. The integrated circuit structure of claim 10 further comprising a plurality of conductive vias located between the $M_{top}$ plate and the $M_{top-1}$ plate and electrically connecting the $M_{top}$ plate and the $M_{top-1}$ plate.

12. The integrated circuit structure of claim 10, wherein the $M_{top-1}$ plate has an area greater than the area of the bond pad.

13. The integrated circuit structure of claim 10, wherein the $M_{top-1}$ plate is a dummy layer with substantially no current flowing through.

14. The integrated circuit structure of claim 10 further comprising:
a third dielectric layer underlying the second dielectric layer; and
an $M_{top-2}$ plate located in the third dielectric layer.

15. The integrated circuit structure of claim 14, wherein the first dielectric layer and the second dielectric layer have dielectric constants of greater than about 3.0, and the third dielectric layer has a dielectric constant of less than about 3.0.

16. The integrated circuit structure of claim 10, wherein the $M_{top-1}$ plate is not solid.

17. The integrated circuit structure of claim 16, wherein the $M_{top-1}$ plate comprises a slot formed therein.

18. The integrated circuit structure of claim 16, wherein the $M_{top-1}$ plate comprises a hollow portion therein.

19. An integrated circuit structure comprising:
a first bond pad;
a first dielectric layer underlying the first bond pad;
an $M_{top}$ plate located in the first dielectric layer and underlying the first bond pad, the $M_{top}$ plate being a solid conductive plate and electrically coupled to the first bond pad, at least one corner of the $M_{top}$ plate being greater than 90 degrees;
a first passivation layer over the first dielectric layer, wherein the first passivation layer has at least a portion under a middle portion of the first bond pad;
an active circuit comprising at least a portion located under the first bond pad; and
a second bond pad, wherein no active circuit is located under the second bond pad.

20. The integrated circuit structure of claim 19, wherein an area of the $M_{top}$ plate is greater than about an area of the first bond pad.

* * * * *

UNITED STATES PATENT AND TRADEMARK OFFICE
CERTIFICATE OF CORRECTION

PATENT NO. : 7,592,710 B2  Page 1 of 1
APPLICATION NO. : 11/409297
DATED : September 22, 2009
INVENTOR(S) : Hsia et al.

It is certified that error appears in the above-identified patent and that said Letters Patent is hereby corrected as shown below:

In Col. 7, line 1, claim 1, delete "die" and insert --the--.

Signed and Sealed this

Third Day of November, 2009

David J. Kappos
*Director of the United States Patent and Trademark Office*